United States Patent
Hopkins et al.

(10) Patent No.: US 11,997,814 B2
(45) Date of Patent: May 28, 2024

(54) CABLE ORGANIZERS WITH QUICK-RELEASE MECHANISMS

(71) Applicant: Elevation Lab, Inc., Portland, OR (US)

(72) Inventors: Casey Hopkins, Portland, OR (US); Jacob Hull, Portland, OR (US)

(73) Assignee: ELEVATION LAB, INC., Portland, OR (US)

( * ) Notice: Subject to any disclaimer, the term of this patent is extended or adjusted under 35 U.S.C. 154(b) by 180 days.

(21) Appl. No.: 17/579,741

(22) Filed: Jan. 20, 2022

(65) Prior Publication Data
US 2023/0232562 A1 Jul. 20, 2023

(51) Int. Cl.
*H05K 7/12* (2006.01)
*A47B 21/06* (2006.01)

(52) U.S. Cl.
CPC ............ *H05K 7/12* (2013.01); *A47B 21/06* (2013.01)

(58) Field of Classification Search
CPC .................................. H05K 7/12; A47B 21/06
See application file for complete search history.

(56) References Cited

U.S. PATENT DOCUMENTS

| | | | | |
|---|---|---|---|---|
| 6,505,384 B1* | 1/2003 | Renton | ................. | F16G 11/106 24/132 WL |
| 9,638,354 B1* | 5/2017 | Ogueli | ................. | A61M 5/1418 |
| 10,485,954 B2* | 11/2019 | Nilson | ................. | A61M 25/02 |
| 2004/0007640 A1* | 1/2004 | West | ................. | B65H 75/06 242/402 |
| 2008/0253730 A1* | 10/2008 | Cox | ................. | G02B 6/4444 385/138 |
| 2010/0200273 A1* | 8/2010 | Seil | ................. | H02G 3/32 174/135 |
| 2014/0110150 A1* | 4/2014 | Huang | ................. | H02G 11/02 174/135 |
| 2015/0097090 A1* | 4/2015 | Musick | ................. | H01R 13/72 248/65 |
| 2015/0187460 A1* | 7/2015 | DeLoache | ............. | A47B 21/06 248/68.1 |
| 2016/0355374 A1* | 12/2016 | Sinnett | ................. | B65H 75/366 |

(Continued)

FOREIGN PATENT DOCUMENTS

KR 101165035 B1 * 7/2012

OTHER PUBLICATIONS

Fuse side winder Cable Winder and Organizer sold on amazon.com, first available date: Oct. 17, 2019, https://www.amazon.com/Headphone-Organizer-Perfect-Wrapping-Organization/dp/B07Z8G6VH4 (Year: 2019).*

(Continued)

*Primary Examiner* — Terrell L Mckinnon
*Assistant Examiner* — Ding Y Tan
(74) *Attorney, Agent, or Firm* — Kolitch Romano Dascenzo Gates LLC

(57) ABSTRACT

Cable organizers including a body, a clamp, and a cleat. The body defines a channel complementarily configured with a cable. The clamp and the cleat are mounted to the body proximate the channel. The clamp and the cleat are configured to selectively secure the cable to the body in the channel. The cleat is configured to selectively secure the cable to the body in the channel. In some examples, the cable organizer includes an adhesive layer and/or a sled mechanism.

19 Claims, 11 Drawing Sheets

(56) References Cited

U.S. PATENT DOCUMENTS

2019/0113156 A1\* 4/2019 Herbert .................... F16L 3/13
2020/0031610 A1\* 1/2020 Britt ....................... B65H 75/14

OTHER PUBLICATIONS

Elevation Lab QuickDraw under-desk cord mount online product page, earliest dated by web.archive.org at Nov. 24, 2021 https://www.elevationlab.com/products/quickdraw (Year: 2021).\*

"Introducing QuickDraw" youtube video dated Nov. 22, 2021 posted by Elevation Lab, https://www.youtube.com/watch?v=ALZDjSPSJCI (Year: 2021).\*

Benny Johansson "Cable Holder for Desktop" webpage dated Feb. 23, 2014 on instructables.com, https://www.instructables.com/Cable-Holder-for-Desktop/ (Year: 2014).\*

Vothoon cable holder organizer with adhesive backing sold on amazon.com dated Aug. 9, 2020, https://www.amazon.com/Holder-Management-Organizer-Adhesive-Backing/dp/B08FFT9C6Z (Year: 2020).\*

Viaky cable clamps/clips sold on amazon; https://www.amazon.com/Viaky-Adjustable-Adhesive-Management-Organizer/dp/B07RL1DV61 (Year: 2019).\*

Cable Management for Standing Desk 10 Items & Useful Tips posted on Autonomous, https://www.autonomous.ai/ourblog/a-full-guide-of-cable-management-for-standing-desk-with-7-tips (Year: 2020).\*

\* cited by examiner

CABLE ORGANIZERS WITH QUICK-RELEASE MECHANISMS

BACKGROUND

The present Disclosure relates generally to cable organizers. In particular, cable organizers with quick-release mechanisms are described.

Known cable organizers are not entirely satisfactory for the range of applications in which they are employed. For example, existing cable organizers are not sufficiently convenient to use. Indeed, conventional cable organizers do not allow users to quickly access and use the cable being organized. Some existing cable organizers make it difficult to grab onto the cable and to move the cable relative to the cable organizer to selectively connect it to a device.

Conventional cable organizers are often not configured to mount in a convenient and aesthetically pleasing position. For example, many conventional cable organizers are designed to be placed on the work surface of a desk, which can cause the cable organizer and cable to be in the way and to clutter ones workspace. Further, a cable organizer on a work surface makes the cable organizer visible and can detract from the aesthetics of ones workstation. Some existing cable organizers are not designed to reside close to where a user is working, which makes them inconvenient to use.

Further, some conventional cable organizers do not allow the length of the cable extending from the cable organizer to be adjusted. It is often desirable to change how much of the cable extends from the cable organizer, such as to connect to different devices different distances away from the cable organizer or to accommodate moving a device relative to the cable organizer. It is generally desirable to limit how much of the cable extends from the cable organizer to avoid excess length of cable creating clutter.

Thus, there exists a need for eagle organizers that improve upon and advance the design of known cable organizers. Examples of new and useful cable organizers relevant to the needs existing in the field are discussed below.

SUMMARY

The present disclosure s directed to cable organizers including a body, a clamp, and a cleat. The body defines a channel complementarily configured with a cable. The clamp and the cleat are mounted to the body proximate the channel. The clamp and the cleat are configured to selectively secure the cable to the body in the channel. The cleat is configured to selectively secure the cable to the body in the channel. In some examples, the cable organizer includes an adhesive layer and/or a sled mechanism.

DETAILED DESCRIPTION

Figure 1:
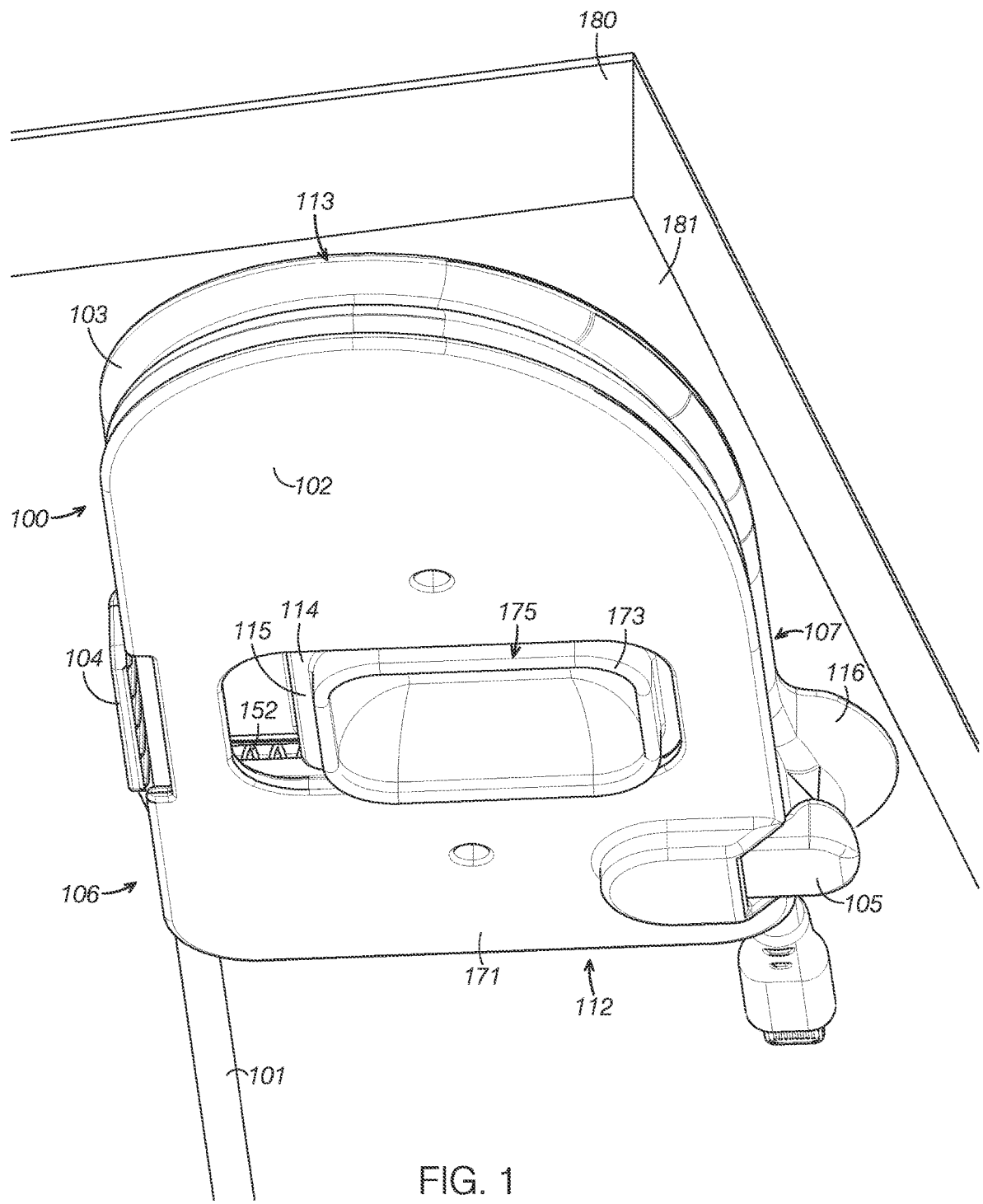
FIG. 1 is a view of a cable organizer mounted to the underside of a desk and supporting a cable with a clamp and a cleat.

The disclosed cable organizers will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually describes; in the following detailed description.

Throughout the following detailed description, examples of various cable organizers are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

Definitions

The following definitions apply herein, unless otherwise indicated.

"Substantially" means to be more-or-less conforming to the particular dimension, range, shape, concept, or other aspect modified by the term, such that a feature or component need not conform exactly. For example, a "substantially cylindrical" object means that the object resembles a cylinder, but may have one or more deviations from a true cylinder.

"Comprising," "including," and "having" (and conjugations thereof) are used interchangeably to mean including but not necessarily limited to, and are open-ended terms not intended to exclude additional elements or method steps not expressly recited.

Terms such as "first", "second", and "third" are used to distinguish or identify various members of a group, or the like, and are not intended to denote a serial, chronological, or numerical limitation.

"Coupled" means connected, either permanently or releasably, whether directly or indirectly through intervening components.

Cable Organizers with Quick-Release Mechanisms

With reference to the figures, cable organizers with quick release-mechanisms will now be described. The cable organizers discussed herein selectively secure to structures. The cable organizers discussed below organize a cable in a way that makes the cable easily accessible. Further, the cable organizers described herein enable a user to conveniently adjust the length of the cable extending from the cable organizer.

The reader appreciate from the figures and description below that the presently disclosed cable organizers address many of the shortcomings of conventional cable organizers. For example, the novel cable organizers below are convenient to use. The novel cable organizers discussed herein allow users to quick access and use the cable organized by the cable organizer. The novel cable organizers below are configured to make it easy for a user to grab onto the cable and to move it relative to the cable organizer to selectively connect the cable to a device.

Further improving over conventional cable organizers, the novel cable organizers discussed herein are configured to mount in convenient and aesthetically pleasing positions. Regarding convenience, the novel cable organizers below are configured to reside close to where a user is working, which makes them convenient to use. The close proximity of the cable organizer to the user makes the cable convenient to access when needed and convenient to store when not needed.

Regarding aesthetics, the novel cable organizers described below are configured to mount to the underside of a table if desired rather than resting on a top of the table. Additionally or alternatively, the novel cable organizers below may selectively secure to a vertical surface, such as a wall or side of a desk. As a result, the novel cable organizers avoid being in the way and cluttering ones workspace. Further, the novel cable organizers below can be mounted in unseen positions to avoid detracting From the aesthetics of one's workstation.

Importantly, the novel cable organizers discussed herein allow the length of the cable extending from the cable organizer to be adjusted. It is often desirable to change how much of the cable extends from the cable organizer, such as to connect to different devices that are different distances away from the cable organizer or to accommodate moving a device relative to the cable organizer. Further, the novel cable organizers enable limiting how much of the cable extends from the cable organizer to avoid excess length of cable creating clutter. The novel cable organizers allow the user to extend out as much length of cable is needed and to shorten the length of free cable to avoid excess cable length creating clutter.

Contextual Details

Ancillary features relevant to the cable organizers described herein will first be described to provide context and to aid the discussion of the cable organizers.

Cable

The cable organizers discussed below function to organize cables. One example of a cable, cable 101, is shown in FIGS. 1-11.

Cable 101 is a universal serial bus (USB) cable, but the cable may be any currently known or later developed type of cable. The reader will appreciate that a variety of cable types exist and could be used in place of the cable shown in the figures. In addition to the types of cables existing currently, it is contemplated that the cable organizers described herein could incorporate new types of cables developed in the future.

The size and shape of the cable may be varied as needed for a given application. In some examples, the cable is larger relative to the other components than depicted in the figures. In other examples, the cable is smaller relative to the other components than depicted in the figures. Further, the reader should understand that the cable and the other components may all be larger or smaller than described herein while maintaining their relative proportions.

Structure

The cable organizers described below may be secured to structures. The structures may be furniture, walls, or a wide variety of other items. Often, the cable organizers will secure to surfaces of the structure. The surfaces n n be horizontal, vertical, or angles in between.

Figure 2:
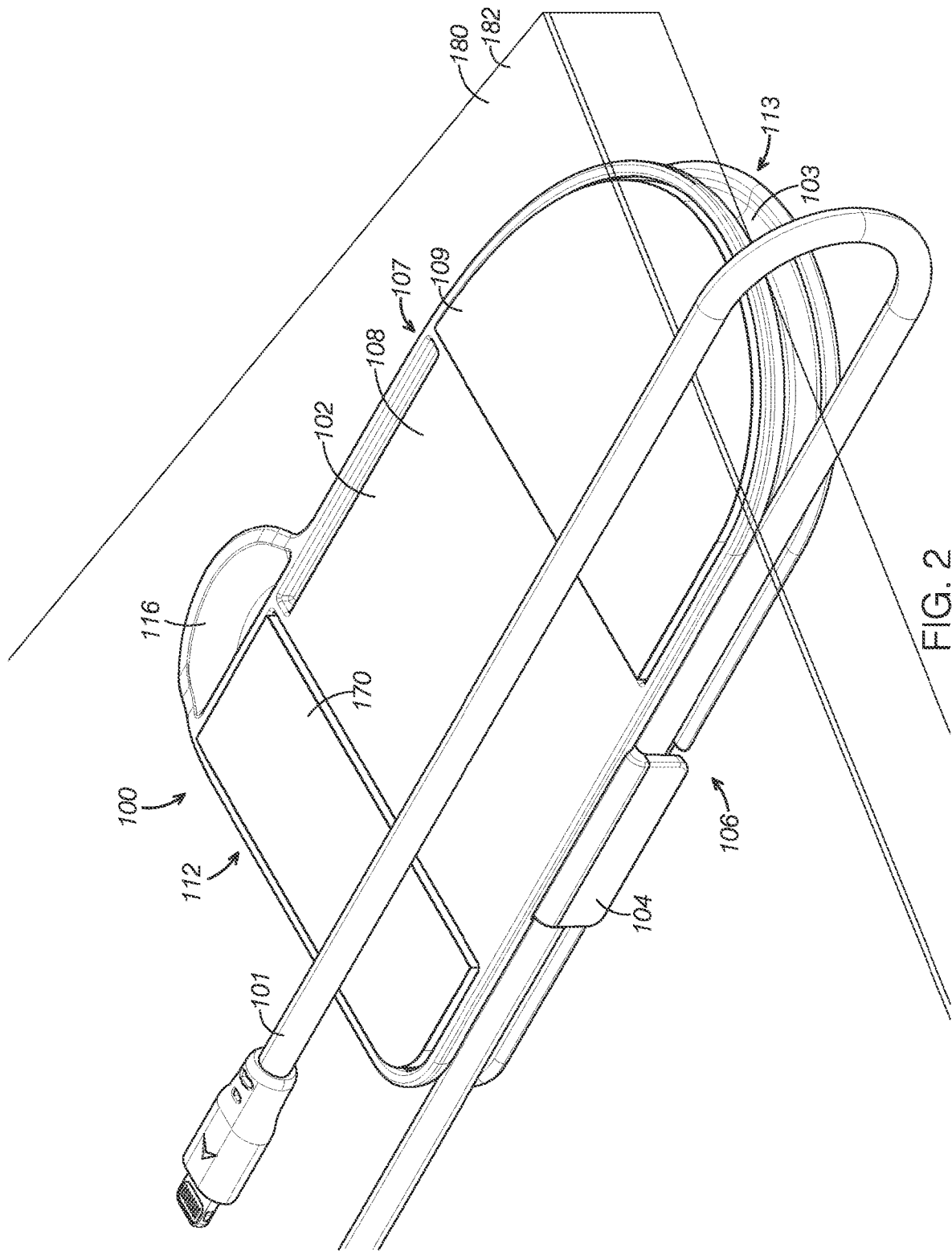
FIG. 2 is a view of the cable organizer shown in FIG. 1 mounted to the underside of the tabletop with a portion of the cable supported by the clamp and the cable selectively decoupled from the cleat to enable the cable to connect to a device on the top of the tabletop.
Figure 3:
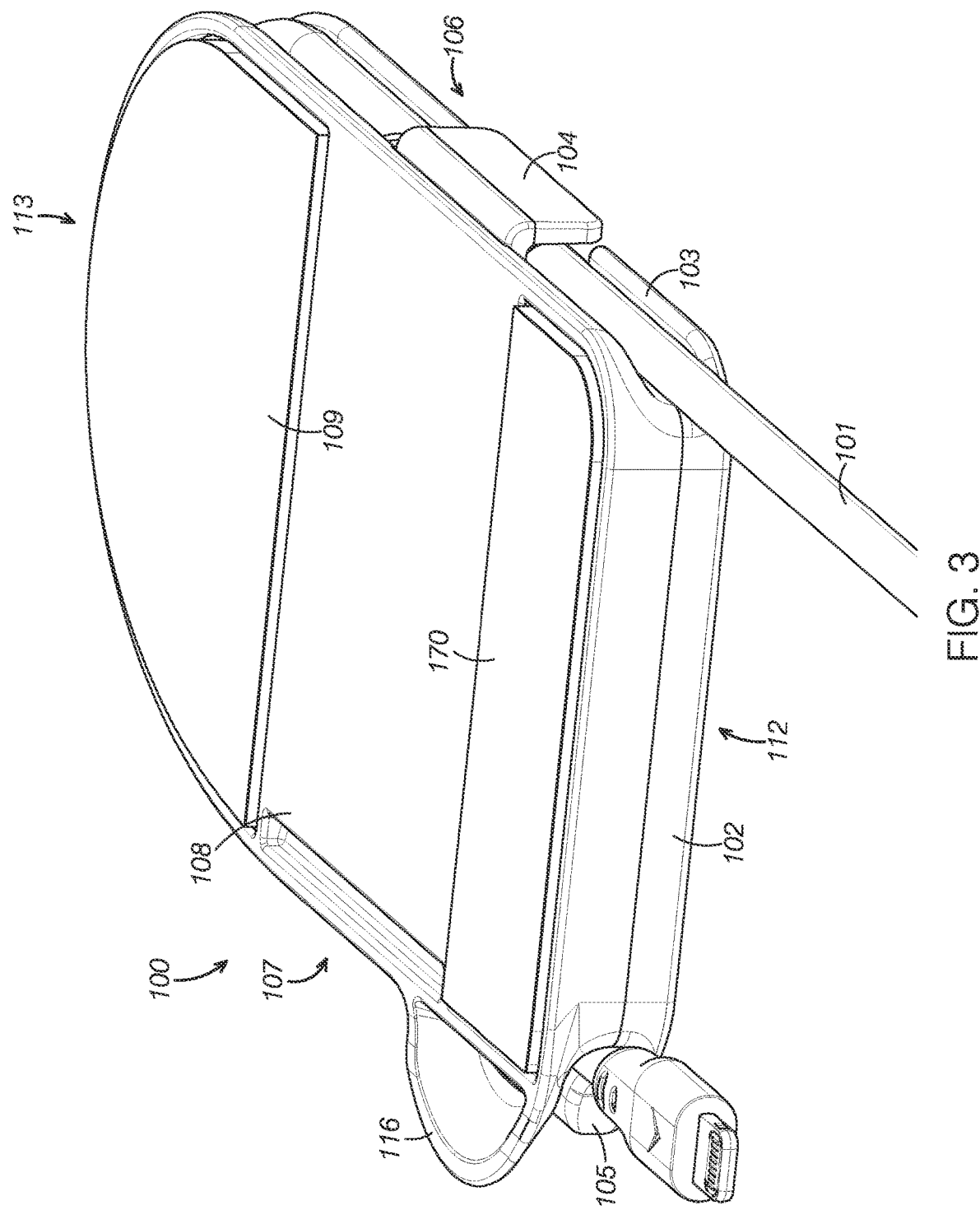
FIG. 3 is a top-front perspective view of the cable organizer shown in FIG. 1.

In FIGS. 1 and 2, a structure 180 in the form of a table top is depicted. Cable organizer 100 is selectively secured to the bottom or underside surface 181 of structure 180. However, the cable organizer may selectively secure to the top surface 182 or to front, rear, or lateral side surfaces of structure 180 instead.

Securing cable organizer 100 to underside surface 181 of structure 180 provides certain advantages. For example, cable organizer 100 is less visible underneath structure 180, which provides aesthetic benefits. Further, cable organizer 100 is out of the way to avoid clutter on top surface 182 when secured to underside surface 181 of structure 180.

Cable Organizer Embodiment One

With reference to FIGS. 1-11, a cable organizer 100 will now be described as a first example of a cable organizer. The reader can see in FIGS. 1-11 that cable organizer 100 includes a body 102, a clamp 104, a cleat 105, a first adhesive layer 109, a second adhesive layer 170, and a sled mechanism 175. Cleat 105 defines a quick-release mechanism. In other examples, the cable organizer includes fewer components than depicted in the figures. In certain examples, the cable organizer includes additional or alternative components than depicted era the figures.

The size and shape of the cable organizer may be varied as needed for a given application. In some examples, the cable organizer is larger relative to the other components than depicted in the figures. In other examples, the cable organizer is smaller relative to the other components than depicted in the figures. Further, the reader should understand that the cable organizer and the other components may all be larger or smaller than described herein while maintaining their relative proportions.

Body

Body 102 functions to support other components of cable organizer 100, including clamp 104, cleat 105, adhesive layers 109 and 170, and sled mechanism 175. With reference to FIGS. 1-11, body 102 includes a first lateral side 106, a second lateral side 107, a first longitudinal side 112, a second longitudinal side 113, a first major face 108, a second major face 171, and a backstop 116. As shown in FIGS. 1-4 and 6-11, body 102 defines a channel 103 complementarily configured with cable 101.

The reader can see in FIGS. 1-11 that second lateral side 107 is opposite first lateral side 106. With reference to FIGS. 1-11, first longitudinal side 112 and second longitudinal side 113 are disposed between first lateral side 106 and second lateral side 107. As depicted in FIGS. 1-11, second longitudinal side 113 is opposite first longitudinal side 112.

As depicted in FIGS. 1-5, and 8-11, first major face 108 and second major face 171 extend between first lateral side 106 and second lateral side 107. Adhesive layers 109 and 170 are disposed on first major face 108.

As shown in FIGS. 1-10, backstop 116 is aligned with cleat 105 on an opposite side of channel 103 from cleat 105. Cleat 105 and backstop 116 cooperate to selectively secure cable 101 between them. Cleat 105 and backstop 116 collectively define a quick-release mechanism.

The size and shape of the body may be varied as needed for a given application. In some examples, the body is larger relative to the other components than depicted in the figures. In other examples, the body is smaller relative to the other components than depicted in the figures. Further, the reader should understand that the body and the other components may all be larger or smaller than described herein while maintaining their relative proportions.

In the present example, the body is composed of plastic. However, the body may be composed of any currently known or later developed material suitable for the applications described herein for which it is used. Suitable materials include metals, polymers, ceramics, wood, and composite materials.

Channel

The role of channel 103 is to receive and guide cable 101. As shown in FIGS. 1-11, channel 103 extends around an outer periphery of body 102. The reader can see in FIGS. 1-7 that channel 103 is curved at second longitudinal side 113. As depicted in FIGS. 1-7, channel 103 extends continuously along first lateral side 106, second longitudinal side 113, and second lateral side 107.

The size and shape of the channel may be varied as needed for a given application. In some examples, the channel is larger relative to the other components than depicted in the figures. In other examples, the channel is smaller relative to the other components than depicted in the figures. Further, the reader should understand that the channel and the other components may all be larger or smaller than described herein while maintaining heir relative proportions.

Clamp

As shown in FIGS. 1-8, 10, and 11, clamp 104 is configured to selectively secure cable 101 to body 102 in channel 103. With reference to FIGS. 1-8, 10, and 11, clamp 104 is mounted to body 102 proximate channel 103 on first lateral side 106. In the particular example shown in FIGS. 1-8, 10, and 11, clamp 104 is mounted to body 102 on first lateral side 106 proximate first longitudinal side 112.

With reference to FIGS. 1, 4, 6, and 7, clamp 104 is mounted to sled 114 to selectively move relative to body 102. By selectively moving relative to body 102, clamp 104 is configured to selectively receive and secure cable 101 between clamp 104 and body 102. In particular, clamp 104 secures cable 101 between clamp 104 and channel 103. As shown in FIGS. 1, 4, 6, and 7, clamp 104 is mounted to terminal end 115 of sled 114 outside body 102 proximate channel 103.

The number of clamps in the cable organizer may be selected to meet the needs of a given application. The reader should appreciate that the number of clamps may be different in other examples than is shown in the figures. For instance, some cable organizer examples include additional or fewer clamps than described in the present example.

In the present example, the clamp is composed of plastic. However, the clamp may be composed of any currently known or later developed material suitable for the applications described herein for which it is used. Suitable materials include metals, polymers, ceramics, wood, and composite materials.

The clamp may be a any currently known or later developed type of clamp. The reader will appreciate that a variety of clamp types exist and could be used in place of the clamp shown in the figures. In addition to the types of clamps existing currently, it is contemplated that the cable organizers described herein could incorporate new types of clamps developed in the future.

The size and shape of the clamp may be varied as needed for a given application. In some examples, the clamp is larger relative to the other components than depicted in the figures. In other examples, the clamp is smaller relative to the other components than depicted in the Figures. Further, the reader should understand that the clamp and the other components may all be larger or smaller than described herein while maintaining their relative proportions.

Cleat

The reader can see in FIGS. 1, 4, and 8-10 that cleat 105 is configured to cooperate with backstop 116 to selectively secure cable 101 to body 102 in channel 103. Cleat 105 and backstop 116 collectively define a quick-release mechanism. As depicted in FIGS. 1, 4, and 8-10, cleat 105 is mounted to body 102 proximate channel 103.

As shown in FIGS. 1, 4, and 8-10, cleat 105 is mounted to body 102 on second lateral side 107. In particular, the reader can see in FIGS. 1, 4, and 8-10 that cleat 105 is mounted to body 102 on second lateral side 107 proximate first longitudinal side 112. With reference to FIGS. 1, 4, 8, and 10, the reader can see that cleat 105 is spaced from clamp 104 on an opposite side of body 102.

As depicted in FIGS. 1, 4, and 8-10, cleat 105 is pivotally mounted to body 102. With reference to FIGS. 1, 4, and 8-10, cleat 105 is configured to be manually pivoted away from backstop 116 to receive cable 101 between cleat 105 and backstop 116.

As shown in FIGS. 1, 4, and 8-10, cleat 105 is biased to a position proximate backstop 116. The reader can see in FIGS. 1, 4, and 8-10 that the bias of cleat 105 compresses cable 101 against backstop 116 when cable 101 is disposed between cleat 105 and backstop 116 aid cleat 105 is not manually pivoted away from backstop 116.

The cleat may be any currently known or later developed type of cleat. The reader will appreciate that a variety of cleat types exist and could be used in place of the cleat shown in the figures. In addition to the types of cleats existing currently, it is contemplated that the cable organizers described herein could incorporate new types of cleats developed in the future.

The number of cleats in the cable organizer may be selected to meet the needs of a given application. The reader should appreciate that the number of cleats may be different in other examples than is shown in the figures. For instance, some cable organizer examples include additional or fewer cleats than described in the present example.

The size and share of the cleat may be varied as needed for a given application. In some examples, the cleat s larger relative to the other components than depicted in the figures. In other examples, the cleat is smaller relative to the other components than depicted in the figures. Further, the reader should understand that the cleat and the other components may all be larger or smaller than described herein while maintaining their relative proportions.

In the present example, the cleat is composed of plastic. However, the cleat may be composed of any currently known or later developed material suitable for the applications described herein for which it is used. Suitable materials include metals, polymers, ceramics, wood, and composite materials.

Adhesive Layers

As depicted in FIGS. 1 and 2, first adhesive layer 109 and second adhesive layer 170 are configured to secure body 102 to a structure 110. For example, as depicted in FIGS. 1 and 2, adhesive layers 109 and 170 configured to secure body 102 to an underside of structure 110 to be out of sight in a convenient position to access cable 101. In other examples, the adhesive layers function to secure the body to the topside of a structure, such as a desk or table, or to a vertical surface of a wall or structure.

As depicted in FIGS. 1-3, 5, and 8-11, adhesive layers 109 and 170 are disposed on first major face 108. However, the adhesive layers may additionally or alternatively be disposed a second major face of the body opposite the first major face.

The number of adhesive layers in the cable organizer may be selected to meet the needs of a given application. The reader should appreciate that the number of adhesive layers may be different in other examples than is shown in the figures. For instance, some cable organizer examples include additional or fewer adhesive layers than described in the present example.

The size and shape of the adhesive layer may be varied as needed for a given application. In some examples, the adhesive layer is larger relative to the other components than depicted in the figures. In other examples, the adhesive is smaller relative to the other components than depicted in the figures. Further, the reader should understand that the adhesive layer and the other components may all be larger or smaller than described herein while maintaining their relative proportions.

The adhesive layer may be any currently known or later developed type of adhesive or adhesive layer. The reader will appreciate that a variety of adhesive types exist and could be used in place of the adhesive layers shown in the figures. In addition to the types of adhesives existing currently, it is contemplated that the cable organizers described herein could incorporate new types of adhesive developed in the future.

Sled Mechanism

Sled mechanism 175 functions to enable clamp 104 to move between cable receiving and cable securing positions. The reader can see in FIGS. 1, 4, 6, and 7 that sled mechanism 175 is configured to selectively extend clamp 104 from body 102 to increase the space between clamp 104 and channel 103.

With reference to FIGS. 1, 4, 6, and 7, sled mechanism 175 is mounted to body 102 predominately inside body 102. As shown in FIGS. 1, 4, 6, and 7, sled mechanism 175 includes a sled 114, a finger well 173, a first spring 151, and a second spring 152. The reader can see in FIGS. 1, 4, 6, and 7 that sled 114 includes a terminal end 115 distal a center of body 102.

Figure 4:
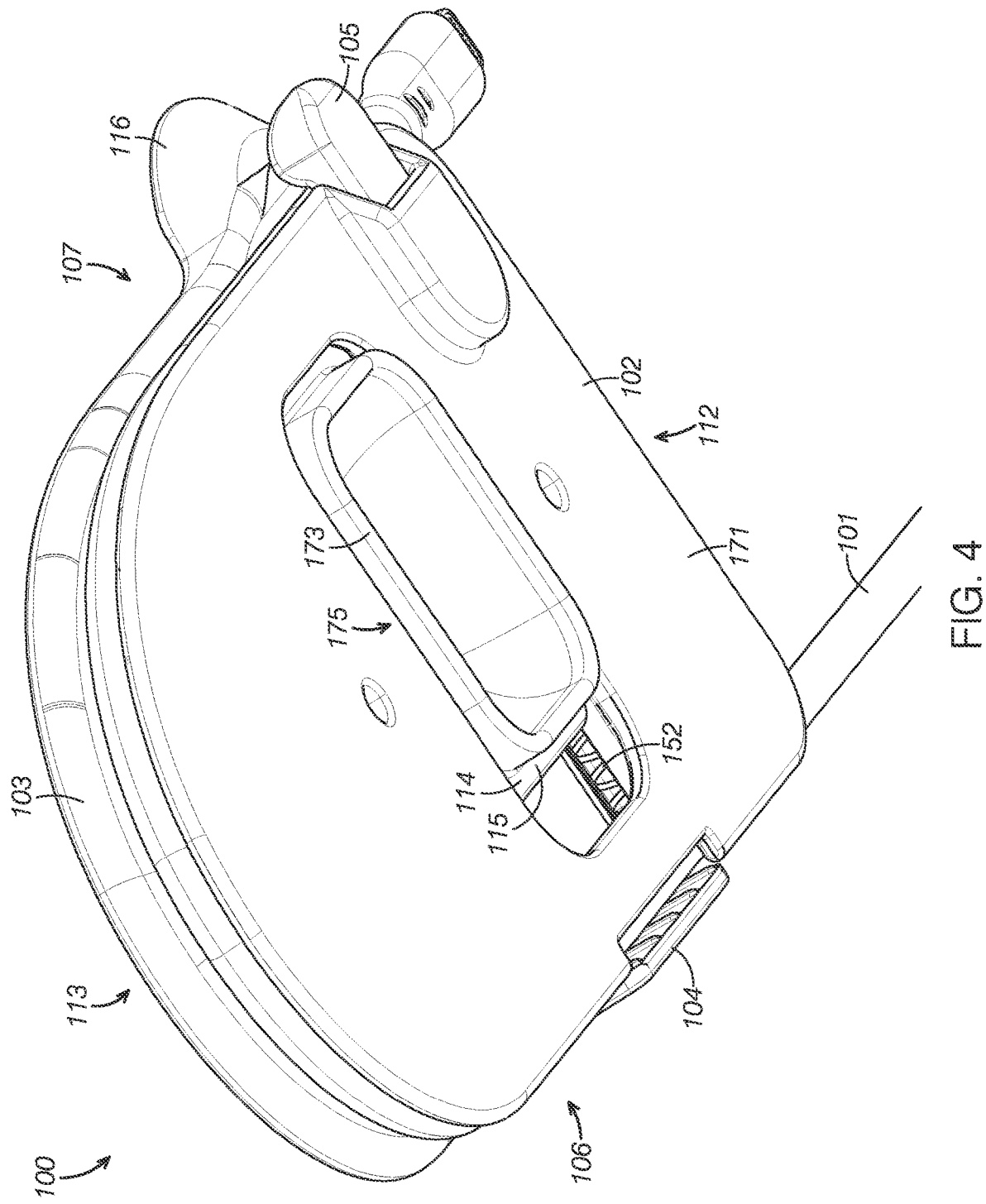
FIG. 4 is a bottom-rear perspective view of the cable organizer shown in FIG. 1.
Figure 5:
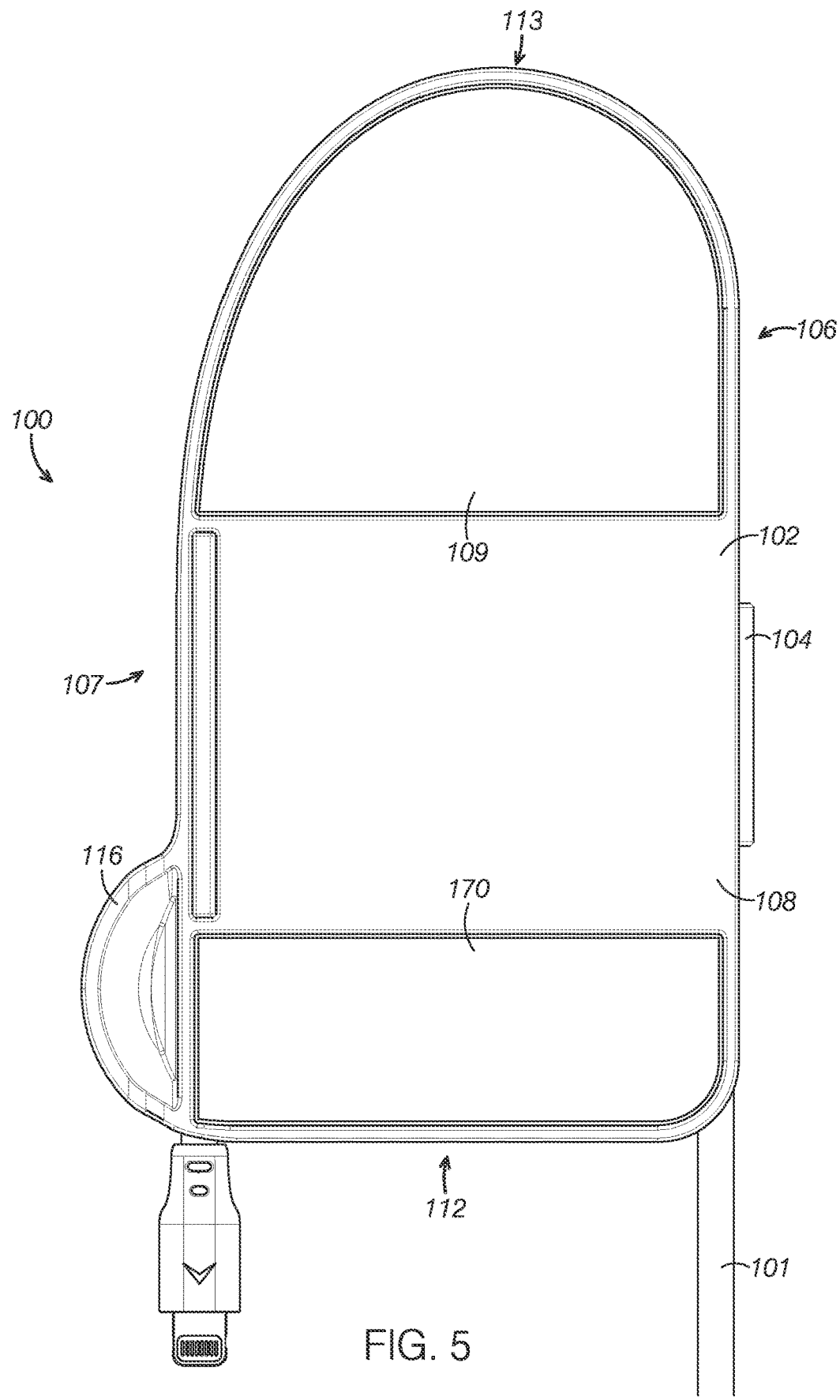
FIG. 5 is a top plan view of the cable organizer shown in FIG. 1.
Figure 6:
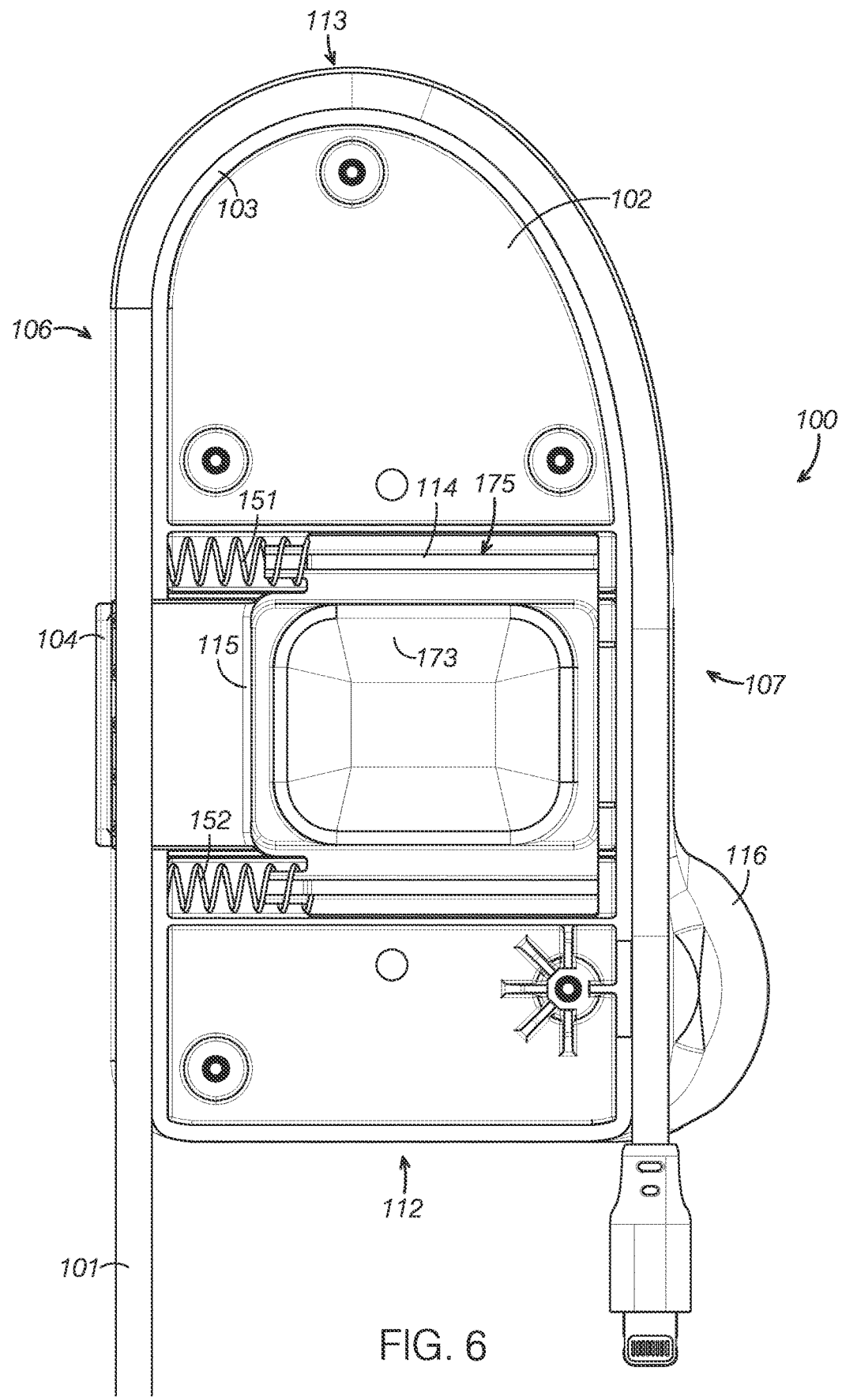
FIG. 6 is a bottom plan view of the cable organizer shown in FIG. 1 with a bottom cover removed to show internal components with a sled mechanism in a cable securing position where the clamp is close to the body.

As depicted in FIGS. 1, 4, 6, and 7, sled 114 is biased to retract into body 102 and to bring clamp 104 proximate channel 103. With reference to FIGS. 1, 4, and 6, the bias of sled 114 compresses cable 101 between clamp 104 and channel 103 when cable 101 is disposed between clamp 104 and channel 103.

Figure 7:
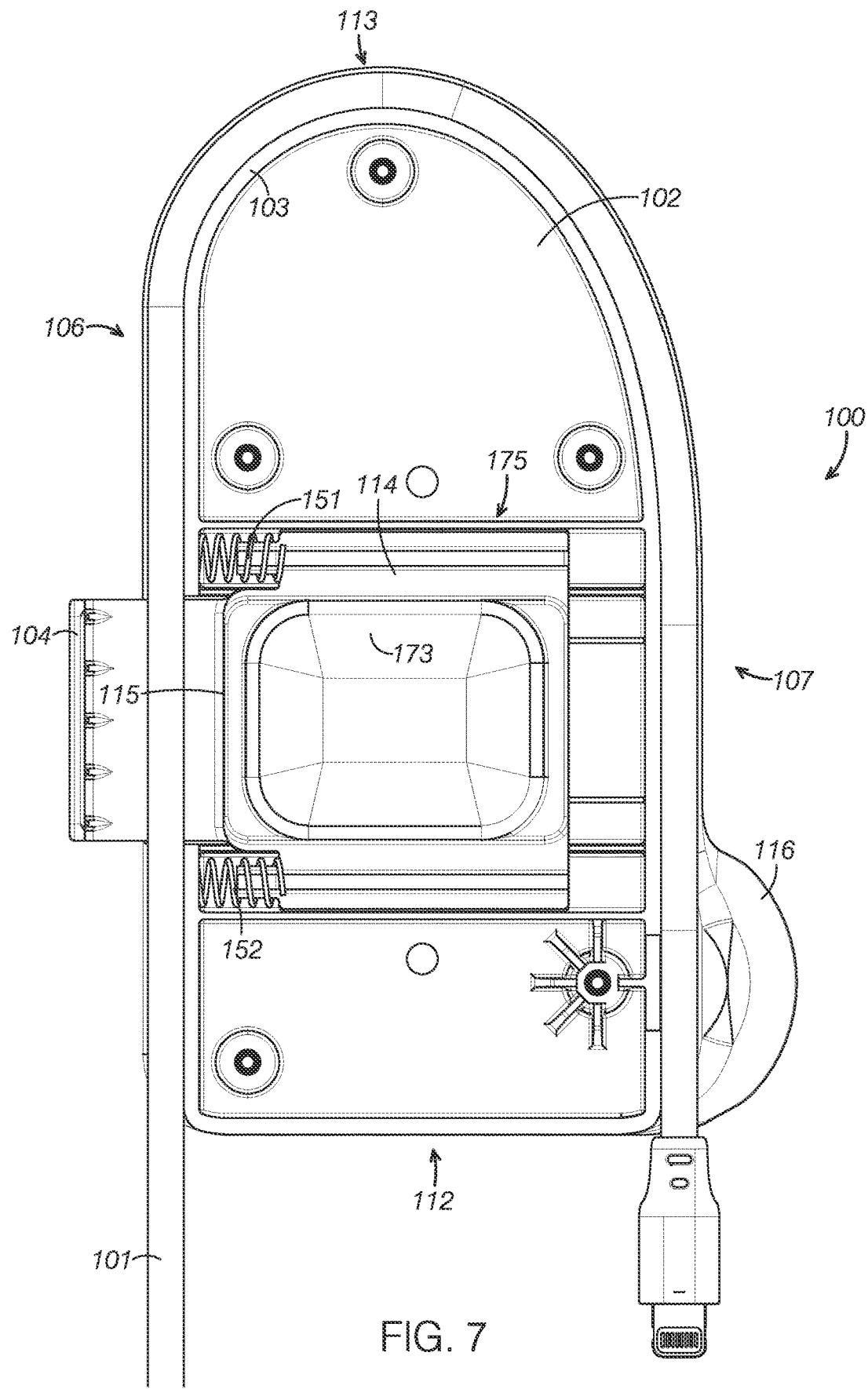
FIG. 7 is a bottom plan view of the cable organizer shown in FIG. 1 with the bottom cover removed to show internal components with the sled mechanism in a cable receiving position where the clamp is extended from the body.
Figure 8:
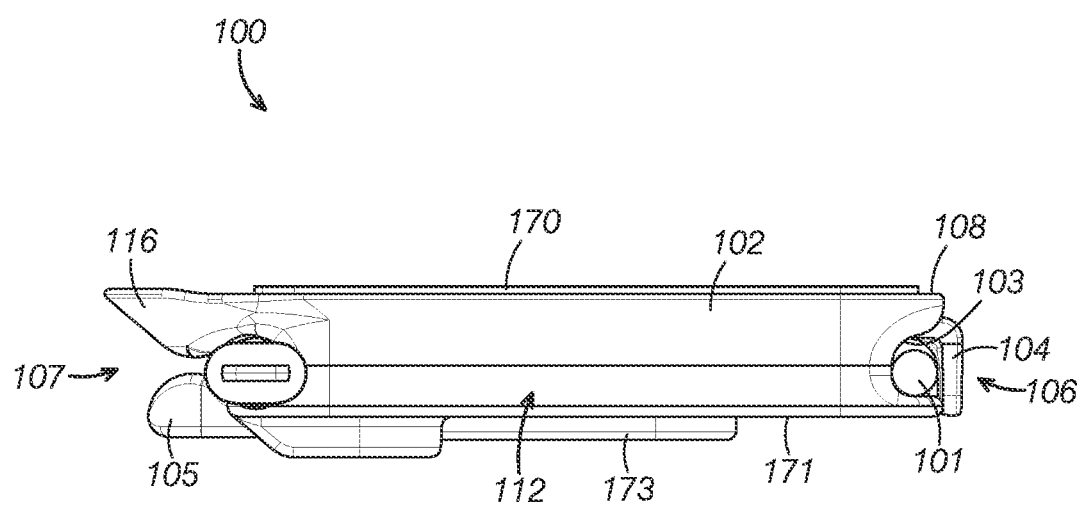
FIG. 8 is a front-side elevation view of the cable organizer shown in FIG. 1.
Figure 9:
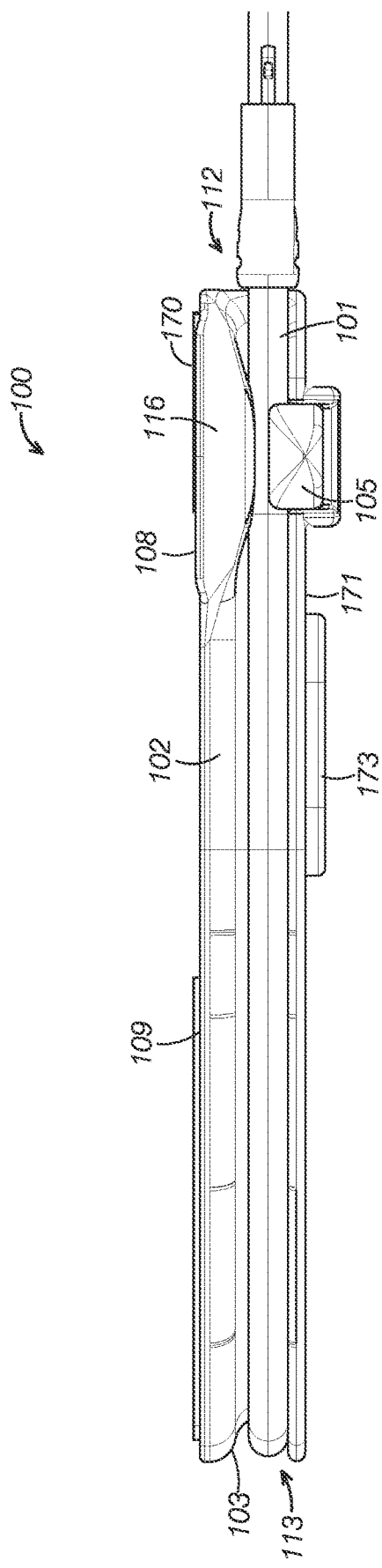
FIG. 9 is a right-side elevation view of the cable organizer shown in FIG. 1.
Figure 10:
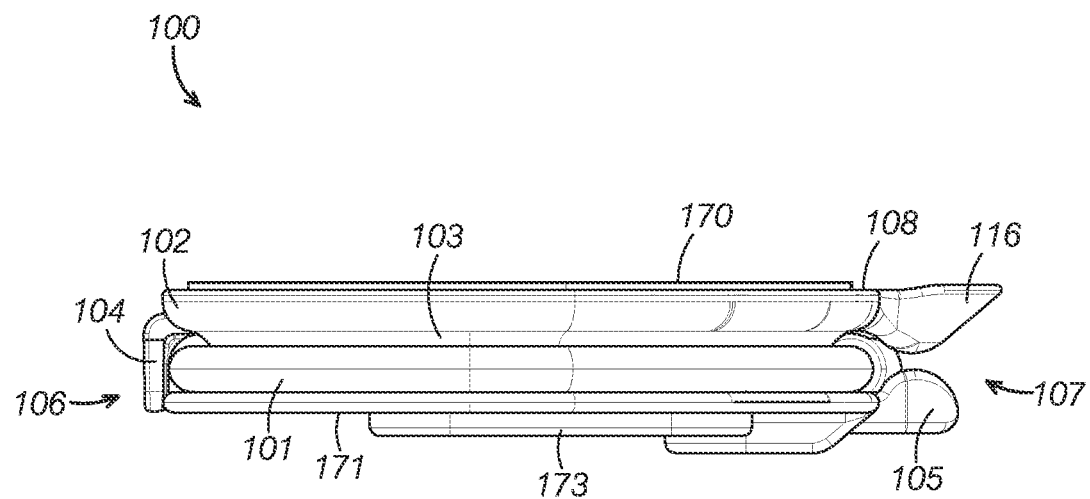
FIG. 10 is a rear-side elevation view of the cable organizer shown in FIG. 1.
Figure 11:
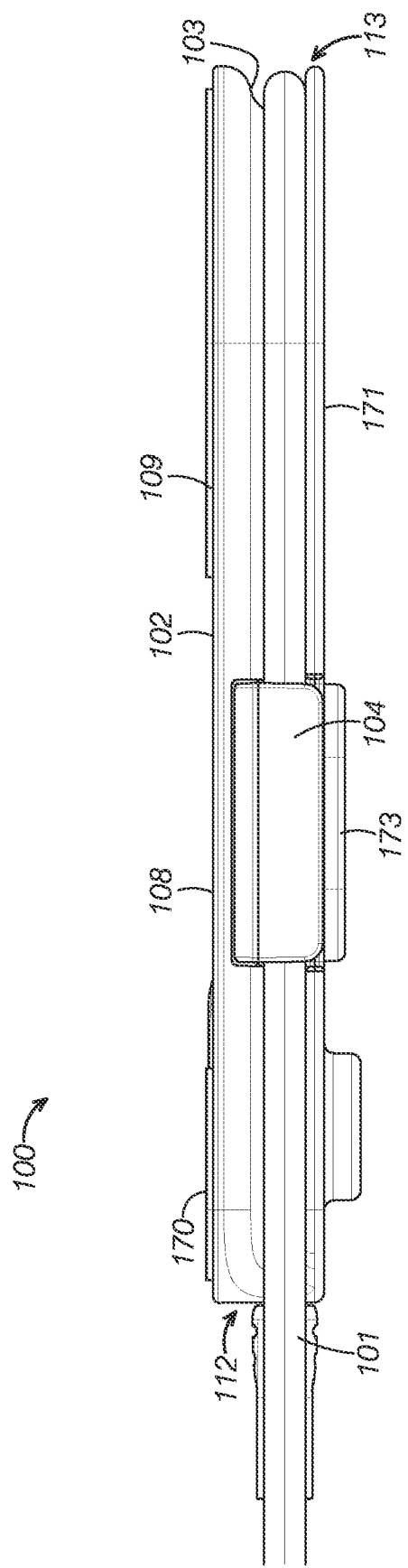
FIG. 11 is a left-side elevation view of the cable organizer shown in FIG. 1.

As shown in FIGS. 6 and 7, springs 151 and 152 are disposed between body 102 and sled 114. Springs 151 and 152 bias sled 114 into the cable securing position where clamp 104 is proximate channel 103. In FIG. 6, clamp 104 is proximate channel 103 and springs 151 and 152 are uncompressed. In FIG. 7, clamp 104 is spaced from channel 103 and springs 151 and 152 are compressed to bias sled 114 and clamp 104 back to the cable securing position.

Finger well 173 functions to assist a user to move sled 114 between the cable receiving position and the cable securing position. Finger well 173 is complementarily configured with a finger to enable a finger to be placed in a cavity of finger well 173 to move sled 114.

The size and shape of the sled mechanism may be varied as needed for a given application. In some examples, the sled mechanism is larger relative to the other components than depicted in the figures. In other examples, the sled mechanism is smaller relative to the other components than depicted in the figures. Further, the reader should understand that the sled mechanism and the other components may all be larger or smaller than described herein while maintaining their relative proportions.

In the present example, the sled and the finger well are composed of plastic. However, the sled and the finger well may be composed of any currently known or later developed material suitable for the applications described herein for which they are used. Suitable materials include metals, polymers, ceramics, wood, and composite materials.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims whether they are directed to the same invention or a different invention and whether they are different, broader, narrower or equal in scope to the original claims, are to be considered within the subject matter of the inventions described herein.

The invention claimed is:

1. A cable organizer for a cable, comprising:
    a body defining a channel complementarily configured with the cable;
    a clamp mounted to the body proximate the channel;
    a cleat mounted to the body proximate the channel; and
    a sled mechanism mounted to the body;
    wherein the clamp is mounted to the sled mechanism and is configured to selectively secure the cable to the body in the channel; wherein the cleat is configured to selectively secure the cable to the body in the channel.

2. The cable organizer of claim 1, wherein the cleat is spaced from the clamp.

3. The cable organizer of claim 1, wherein:
    the body includes a first lateral side and a second lateral side opposite the first lateral side;
    the clamp is mounted to the body on the first lateral side; and
    the cleat is mounted to the body on the second lateral side.

4. The cable organizer of claim 3, wherein:
the body include a first major face extending between the first lateral side and the second lateral side;
the cable organizer further comprises an adhesive layer disposed on the first major face; and
the adhesive layer is configured to secure the body to a structure.

5. The cable organizer of claim 1, wherein the channel extends around an outer periphery of the body.

6. The cable organizer of claim 5, wherein:
the body includes: a first lateral side;
a second lateral side opposite the first lateral side;
a first longitudinal side between the first lateral side and the second lateral side; and
a second longitudinal side opposite the first longitudinal side and between the first lateral side and the second lateral side; and
the channel is curved at the second longitudinal side.

7. The cable organizer of claim 6, wherein the clamp is mounted to the body on the first lateral side proximate the first longitudinal side.

8. The cable organizer of claim 7, wherein the cleat is mounted to the body on the second lateral side proximate the first longitudinal side.

9. The cable organizer of claim 6, wherein the channel extends continuously along the first lateral side, the second longitudinal side, and the second lateral side.

10. The cable organizer of claim 1, wherein the sled mechanism is mounted predominately inside the body.

11. The cable organizer of claim 10, wherein:
the sled mechanism includes a sled;
the sled includes a terminal end distal a center of the body; and
the clamp is mounted to the terminal end of the sled at least partially outside the body proximate the channel.

12. The cable organizer of claim 11, wherein the sled is configured to selectively move to increase the space between the clamp and the channel.

13. The cable organizer of claim 12, wherein the sled is biased to retract the clamp towards the channel.

14. The cable organizer of claim 13, wherein the bias of the sled compresses the cable between the clamp and the channel when the cable is disposed between the clamp and the channel and the clamp is not selectively spaced from the channel by the sled mechanism.

15. The cable organizer of claim 1, wherein the cleat is pivotally mounted to the body.

16. The cable organizer of claim 15, wherein the body includes a backstop aligned with the cleat on an opposite side of the channel from the cleat.

17. The cable organizer of claim 16, wherein the cleat is configured to be manually pivoted away from the backstop to receive the cable between the cleat and the backstop.

18. The cable organizer of claim 17, wherein the cleat is biased to a position proximate the backstop.

19. The cable organizer of claim 18, wherein the bias of the cleat compresses the cable against the backstop when the cable is disposed between the cleat and the backstop and the cleat is not manually pivoted away from the backstop.

* * * * *